US012684861B2

(12) United States Patent

Thomas

(10) Patent No.: US 12,684,861 B2

(45) Date of Patent: Jul. 14, 2026

(54) SUBSTRATE ISOLATED STRAINED GATE-ALL-AROUND FIELD EFFECT TRANSISTOR

(71) Applicant: Applied Materials, Inc., Santa Clara, CA (US)

(72) Inventor: Shawn Thomas, Chesterfield, MO (US)

(73) Assignee: Applied Materials, Inc., Santa Clara, CA (US)

( * ) Notice: Subject to any disclaimer, the term of this patent is extended or adjusted under 35 U.S.C. 154(b) by 340 days.

(21) Appl. No.: 18/381,307

(22) Filed: Oct. 18, 2023

(65) Prior Publication Data

US 2024/0145468 A1      May 2, 2024

Related U.S. Application Data

(60) Provisional application No. 63/419,821, filed on Oct. 27, 2022.

(51) Int. Cl.
H10D 30/67          (2025.01)
H10D 30/01          (2025.01)
(Continued)

(52) U.S. Cl.
CPC ........... H10D 84/83 (2025.01); H10D 30/014 (2025.01); H10D 30/43 (2025.01);
(Continued)

(58) Field of Classification Search
CPC ............. H10D 30/6735; H10D 62/121; H10D 84/0151; H10W 10/014; H10W 10/17
See application file for complete search history.

(56) References Cited

U.S. PATENT DOCUMENTS

| | | | |
|---|---|---|---|
| 6,569,715 B1 | 5/2003 | Forbes | |
| 10,749,032 B2 | 8/2020 | Mohapatra et al. | |

(Continued)

FOREIGN PATENT DOCUMENTS

| | | | |
|---|---|---|---|
| KR | 20210154688 A | 12/2021 | |
| WO | 2017155540 A1 | 9/2017 | |

OTHER PUBLICATIONS

International Search Report and Written Opinion for International Application No. PCT/US2023/035445 dated Feb. 7, 2024.

(Continued)

*Primary Examiner* — Nelson Garces

(74) *Attorney, Agent, or Firm* — Patterson + Sheridan, LLP

(57)          ABSTRACT

Gate-all-around transistor devices and methods for manufacturing the same are provided. The semiconductor device includes a substrate. The substrate includes a plurality of isolation regions formed in the substrate, the plurality of isolation regions comprising an isolation material. The substrate further includes a buffer region formed in the substrate, the buffer region separating adjacent isolation regions. The semiconductor device further includes a plurality of fins, each fin formed on a corresponding isolation region of the plurality of isolation regions. Each fin includes a buffer layer contacting the isolation material and a plurality of silicon layers and a plurality of silicon germanium layers alternatingly arranged in a plurality of stacked pairs on the buffer layer.

20 Claims, 9 Drawing Sheets

(51) Int. Cl.

| | |
|---|---|
| *H10D 30/43* | (2025.01) |
| *H10D 62/10* | (2025.01) |
| *H10D 84/01* | (2026.01) |
| *H10D 84/03* | (2025.01) |
| *H10D 84/83* | (2025.01) |
| *H10W 10/00* | (2026.01) |
| *H10W 10/17* | (2026.01) |

(52) U.S. Cl.
CPC ..... *H10D 30/6735* (2025.01); *H10D 30/6757* (2025.01); *H10D 62/121* (2025.01); *H10D 84/013* (2025.01); *H10D 84/0151* (2025.01); *H10D 84/038* (2025.01); *H10W 10/014* (2026.01); *H10W 10/17* (2026.01)

(56) References Cited

U.S. PATENT DOCUMENTS

| | | | |
|---|---|---|---|
| 11,424,347 | B2 | 8/2022 | Liao et al. |
| 2013/0140576 | A1 | 6/2013 | Mieno et al. |

| | | | | |
|---|---|---|---|---|
| 2016/0336405 | A1 | 11/2016 | Sun et al. | |
| 2019/0043993 | A1 | 2/2019 | Mohapatra et al. | |
| 2020/0043742 | A1* | 2/2020 | Chang | H10P 50/694 |
| 2020/0052120 | A1 | 2/2020 | Colinge et al. | |
| 2021/0013306 | A1 | 1/2021 | Choi et al. | |
| 2021/0135008 | A1* | 5/2021 | Chiang | H10D 30/6735 |
| 2021/0391449 | A1 | 12/2021 | Liao et al. | |
| 2022/0059703 | A1 | 2/2022 | More | |
| 2022/0115387 | A1 | 4/2022 | Yang et al. | |
| 2022/0123123 | A1 | 4/2022 | Kim et al. | |
| 2022/0238650 | A1 | 7/2022 | Wu et al. | |
| 2022/0359734 | A1 | 11/2022 | Liao et al. | |
| 2023/0260849 | A1* | 8/2023 | Chen | H10D 64/017 257/351 |

OTHER PUBLICATIONS

Korean Office Action for Application No. 10-2025-7017253 dated Feb. 25, 2026.

* cited by examiner

300

310    PROVIDE SUBSTRATE

320    FORM ISOLATION REGION

330    RECESS ETCH

340    FORM BUFFER REGION

350    FORM BUFFER LAYER

360    FORM SUPERLATTICE STRUCTURE

365    OPTIONALLY FORM DUMMY GATE

370    PATTERN AND ETCH THE MULTILAYER STRUCTURE TO FORM SOURCE/DRAIN RECESS

380    INNER SPACER FORMATION

390    OPTIONALLY FORM BOTTOM DIELECTRIC ISOLATION

395    SOURCE/DRAIN EPI DEPOSITION

SUBSTRATE ISOLATED STRAINED GATE-ALL-AROUND FIELD EFFECT TRANSISTOR

CROSS-REFERENCE TO RELATED APPLICATIONS

This application claims the benefit of U.S. Provisional Patent Application Ser. No. 63/419,821, filed Oct. 27, 2022, which is incorporated by reference herein in its entirety.

TECHNICAL FIELD

The present disclosure relates to transistor devices and methods for manufacturing transistor devices. More particularly, the present disclosure relates to gate-all-around (GAA) transistor devices and methods for manufacturing the same.

BACKGROUND

The electronics industry is experiencing an ever-increasing demand for smaller and faster electronic devices, which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thus improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all-around transistor (GAA). In a GAA device all side surfaces of the channel region are surrounded by the gate electrode, which allows for fuller depletion in the channel region and results in less short-channel effects due to a steeper sub-threshold current swing and smaller drain induced barrier lowering (DIBL).

As transistor dimensions are scaled down to smaller technology nodes, there is a need for further improvements in GAA design and manufacturing.

SUMMARY

The present disclosure relates to transistor devices and methods for manufacturing transistor devices. More particularly, the present disclosure relates GAA transistor devices and methods for manufacturing the same.

In at least one aspect, a semiconductor device is provided. The semiconductor device includes a substrate. The substrate includes a plurality of isolation regions formed in the substrate, the plurality of isolation regions comprising an isolation material. The substrate further includes a buffer region formed in the substrate, the buffer region separating adjacent isolation regions. The semiconductor device further includes a plurality of fins, each fin formed on a corresponding isolation region of the plurality of isolation regions. Each fin includes a buffer layer contacting the isolation material and a plurality of silicon layers and a plurality of silicon germanium layers alternatingly arranged in a plurality of stacked pairs on the buffer layer.

Implementations may include one or more of the following. The buffer region includes a relaxed Si(1−x)Ge(x) material, wherein x represents a concentration of germanium. The buffer layer includes a crystalline material selected from silicon, silicon germanium, or a combination of silicon and silicon germanium. The concentration of germanium "x" in the relaxed Si(1−x)Ge(x) material forms a germanium concentration gradient in the buffer region. The crystalline material includes the silicon germanium and the silicon germanium has a substantially uniform germanium concentration that is equal to or substantially equal to the germanium concentration "x" in the relaxed Si(1−x)Ge (x) material at a top surface of the buffer region. The semiconductor device further includes source/drain regions formed in source/drain recesses defined by adjacent fins. The semiconductor device further includes a dielectric isolation layer separating the source/drain regions from a top surface of the buffer region. The isolation regions has a thickness that is greater than a thickness of the buffer region.

In another aspect, a method of forming a semiconductor device is provided. The method includes forming a plurality of isolation regions in a silicon substrate. The isolation regions include an isolation material. The method further includes removing a portion of the silicon substrate to form a recess in between adjacent isolation regions. The method further includes filling the recess with a buffer material to form a buffer region. The method further includes growing a buffer layer over the silicon substrate, the isolation material, and the buffer material. The method further includes forming a superlattice structure on the buffer layer. The superlattice structure includes a plurality of silicon layers and a plurality of silicon germanium layers alternatingly arranged in a plurality of stacked pairs. The method further includes patterning and etching the superlattice structure and the buffer layer to form fins from the superlattice structure and the buffer layer. The fins are aligned with the isolation regions and the fins define a source/drain recess. The method further includes filling the source/drain recess with an epitaxial material to form a source/drain region.

Implementations may include one or more of the following. The method further includes forming a dielectric isolation layer in the source/drain recess prior to filling the source/drain recess with the epitaxial material. Filling the recess with the buffer material to form the buffer region, includes epitaxially growing a Si(1−x)Ge(x) material, wherein x represents a concentration of germanium. Growing the buffer layer over the silicon substrate, the isolation material, and the buffer material includes epitaxially growing a crystalline material selected from silicon, silicon germanium, or a combination of silicon and silicon germanium. The concentration of germanium "x" in the relaxed Si(1−x)Ge(x) material forms a germanium concentration gradient in the buffer region. The crystalline material includes the silicon germanium and the silicon germanium has a substantially uniform germanium concentration that is equal to or substantially equal to the germanium concentration "x" in the relaxed Si(1−x)Ge(x) material at a top surface of the buffer region. The crystalline material selective grows in a vertical direction from the buffer region and then grows laterally over the isolation regions.

In yet another aspect, a method of forming a semiconductor device is provided. The method includes forming a plurality of isolation regions in a silicon substrate. The isolation regions include an isolation material. The method further includes removing a portion of the silicon substrate to form a recess in between adjacent isolation regions. The method further includes epitaxially growing a buffer material in the recess to form a buffer region. The method further includes epitaxially growing a buffer layer over the buffer region and the isolation regions, wherein the buffer layer grows epitaxially from the buffer region. The method further includes forming a superlattice structure on the buffer layer. The superlattice structure comprises a plurality of silicon layers and a plurality of silicon germanium layers alternatingly arranged in a plurality of stacked pairs. The method further includes patterning and etching the superlattice structure and the buffer layer to form fins from the superlattice structure and the buffer layer. The fins are aligned with the isolation regions, and the fins define a source/drain recess. The method further includes forming spacers on outer surfaces of the silicon germanium layers. The method further includes filling the source/drain recess with an epitaxial material to form a source/drain region.

Implementations may include one or more of the following. Epitaxially growing the buffer material in the recess includes epitaxially growing a $Si(1-x)Ge(x)$ material, wherein x represents a concentration of germanium. Epitaxially growing the buffer layer over the buffer region and the isolation regions includes epitaxially growing a crystalline material selected from silicon, silicon germanium, or a combination of silicon and silicon germanium. The concentration of germanium "x" in the relaxed $Si(1-x)Ge(x)$ material forms a germanium concentration gradient in the buffer region. The crystalline material includes the silicon germanium and the silicon germanium has a substantially uniform germanium concentration that is equal to or substantially equal to the germanium concentration "x" in the relaxed $Si(1-x)Ge(x)$ material at a top surface of the buffer region.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the aspects, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
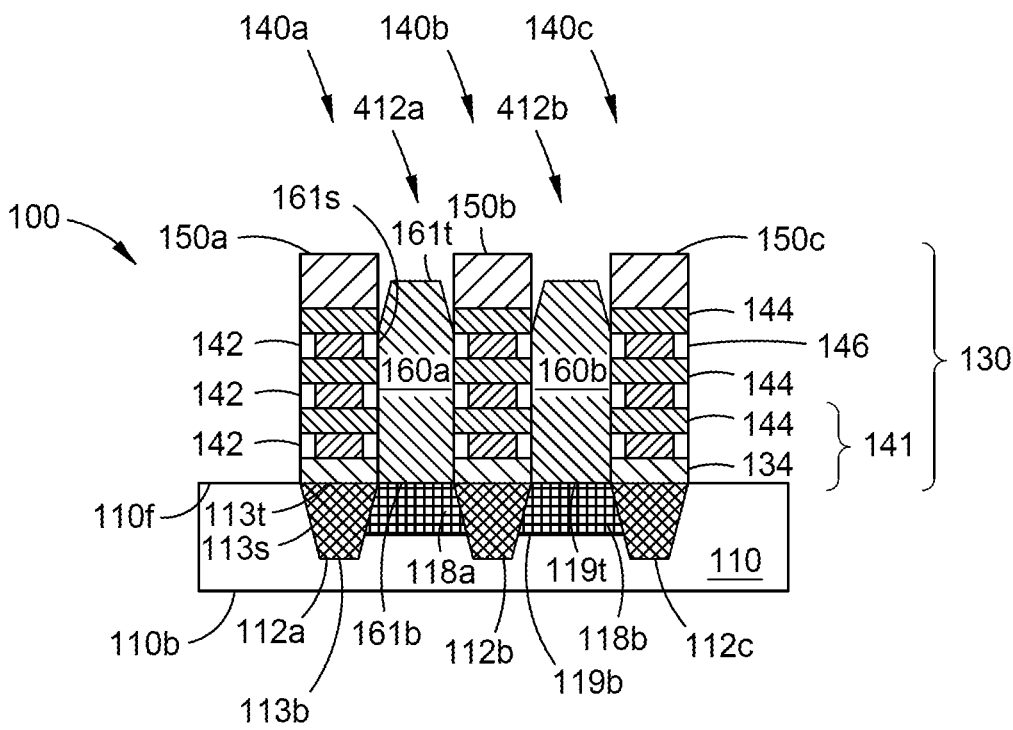
FIG. 1 illustrates a schematic cross-sectional view of a GAA structure in accordance with one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Scaling down of silicon metal oxide semiconductor (MOS) devices has become a major challenge in the semiconductor industry. One problem with the scaling of conventional planar devices are the short channel effects, which start to dominate over device performance. One solution for this problem came with the introduction of multi-gate devices with three-dimensional architecture, such as fin based semiconductor devices or FINFETs and GAA devices. Due to their three-dimensional architecture with either the gate being wrapped around a thin semiconductor fin for FINFET or the gate electrode surrounding all side surfaces of the channel region for GAA, improved gate control (and thus less short channel effects) over the channel could be achieved by using multiple gates. The current state of the art GAA is formed on a bulk silicon substrate with drive current proportional to bulk silicon mobility. Thus, the drive current is limited by the mobility of bulk silicon.

Superlattice structures may be utilized in the fabrication of devices with three-dimensional architecture. These superlattice structures incorporate films, for example, stacks of alternating silicon (Si) layers and silicon germanium (SiGe) layers, which possess varying characteristics depending upon the particular application for which the film is being deposited.

Various aspects described utilize relaxed SiGe buffer and epitaxial lateral overgrowth techniques to create a localized template for strained GAA channel superlattice structures, which enables enhanced mobility and n-FET and p-FET in the same biaxially strained silicon channel. In at least one implementation, the structure further incorporates a bottom dielectric isolation under the channel to reduce substrate leakage currents. The utility of GAA structures for multiple technology nodes is extended by being able to tune the level of strain and thus mobility enhancement in the channel. Techniques for localized substrate isolation are provided without using a full silicon-on-insulator (SOI) substrate. Compared to SOI, costs are reduced and substrate isolation is enabled only where needed instead of all over the wafer as in SOI. Formation of GAA channel region over a dielectric region, for example, a STI region, enables substrate isolation (creates a pseudo-SOI structure), which reduces substrate leakage currents. In addition, creation of a single crystalline material over the dielectric region enables formation of a strained $Si/Si(1-x)Ge(x)$ superlattice for the GAA channel.

FIG. 1 illustrates a schematic cross-sectional view of a gate-all-around (GAA) structure 100 in accordance with one or more implementations of the present disclosure. The GAA structure 100 includes a multi-material layer 130 disposed over a substrate 110. The substrate 110 has a frontside 110f (also referred to as a front surface) and a backside 110b opposite the frontside 110f. The substrate 110 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 110 may have various dimensions, such as 200 mm, 300 mm, 450 mm, or other diameter, as well as, being a rectangular or square panel. Unless otherwise noted, examples described are conducted on substrates with a 200 mm diameter, a 300 mm diameter, or a 450 mm diameter substrate.

The GAA structure 100 further includes isolation regions 112a-c formed in the substrate 110. The isolation regions 112a-c are formed in corresponding trenches 114a-c. In at least one implementation, the isolation regions 112a-c are shallow trench isolations (STIs). The trenches 114a-c extend from the frontside 110f of the substrate 110 into the substrate 110. Thus, a top surface 113t of the isolation regions 112a-c is coplanar or substantially coplanar with the frontside 110f of the substrate 110. The isolation regions 112a-c include a bottom surface 113b, the top surface 113t, and at least one sidewall 113s. The isolation regions 112a-c are formed by filling the trenches 114a-c with an isolation material. In at least one implementation, the isolation material is a dielectric material. In one example, the isolation material comprises, consists of, or consists essentially of silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations thereof, or the like. In one particular implementation, the isolation material comprises, consists of, or consists essentially of silicon oxide.

The GAA structure 100 further includes buffer regions 118a-b formed in the substrate 110. The buffer regions 118a-b are formed in corresponding recesses 120a-b. In at least one implementation, the buffer regions 118a-b are relaxed Si(1–x)Ge(x) buffer regions. Growth of relaxed SiGe buffer material in the buffer regions 118a-b between the isolation regions 112a-c enables dislocations to terminate on the sidewalls of the isolation regions 112a-c are reduce dislocation density at the frontside 110f of the substrate 110. In addition, the buffer regions enable epitaxial lateral overgrowth such that a single crystalline epitaxial layer is formed on the frontside 110f of the substrate 110. The recesses 120a-b extend from the frontside 110f of the substrate 110 into the substrate 110. Thus, a top surface 119t of the buffer regions 118a-b is coplanar or substantially coplanar with the frontside 110f of the substrate 110. The buffer regions 118a-b include a bottom surface 119b, the top surface 119t, and at least one sidewall 119s. In at least one implementation, the buffer regions 118a-b extend from a sidewall of an isolation region to the sidewall of an adjacent isolation region. For example, as shown in FIG. 1, the buffer region 118a extends from the sidewall 113s of the isolation region 112a to the sidewall 113s of the isolation region 112b. In at least one implementation, the bottom surface 119b of the buffer regions 118a-b is offset relative to the bottom surface 113b of the isolation regions 112a-b. In one example, as is shown in FIG. 1, the bottom surface 119b of the buffer regions 118a-b defines a plane that is located above a plane defined by the bottom surface 113b of the isolation regions 112a-b. In another example, the bottom surface 119b of the buffer regions 118a-b extends below the bottom surface 113b of the isolation regions 112a-b. In yet another example, the bottom surface 119b of the buffer regions 118a-b is coplanar or substantially coplanar with the bottom surface 113b of the isolation regions 112a-b. The buffer regions 118a-b are formed by filling the recesses 120a-b with the SRB. In at least one implementation, the strain relaxed buffer material has a graded concentration of at least one component, for example, germanium. In at least one implementation, the SRB material includes Group IV materials, such as silicon and germanium. In one example, the SRB material includes $Si_{1-x}Ge_x$, where x is germanium concentration. The concentration (atomic percent) of germanium in the buffer regions 118a-b may be graded.

The GAA structure 100 further includes the multi-material layer 130. The multi-material layer 130 includes a buffer layer 134, a superlattice structure 141 disposed on the buffer layer 134, and optionally an oxide layer 150a-c disposed on the superlattice structure 141. The oxide layer 150a-c may be a gate oxide layer or a dummy gate oxide layer. In at least one implementation, the buffer layer 134 is a single crystalline epitaxial layer. In at least one implementation, the buffer layer 134 comprises, consists of, or consists essentially of a crystalline material selected from silicon, silicon germanium, or a combination of silicon and silicon germanium. In one example, the buffer layer 134 is a single crystalline silicon layer. In another example, the buffer layer 134 is relaxed epitaxial Si(1–x)Ge(x) buffer material, wherein the germanium concentration "x" is either graded, uniform, or substantially uniform throughout the buffer layer 134. In at least one implementation, a thickness of the buffer layer 134 is in a range from about 20 Å to about 200 Å, such as about 50 Å.

The superlattice structure 141 includes at least one pair of layers, each pair including the first material layer 142 and the second material layer 144. Although the example depicted in FIG. 1 shows three pairs, each pair includes the first material layer 142 and the second material layer 144 (alternating pairs, each pair including the first material layer 142 and the second material layer 144). The number of pairs may be varied based on different process needs with extra or without extra first material layers 142 or second material layers 144 being needed. In one implementation, the thickness of each single first material layer 142 may be between about 20 Å and about 200 Å, such as about 50 Å, and the thickness of the each single second material layer 144 may be between about 20 Å and about 200 Å, such as about 50 Å. The superlattice structure 141 may have a total thickness between about 10 Å and about 5000 Å, such as between about 40 Å and about 4000 Å.

The first material layers 142 are non-crystalline material layers. In at least one implementation, the first material layers 142 are Ge containing layers, such as SiGe layers, Ge layers, or other suitable layers. Alternatively, the first material layers 142 are doped silicon layers, including p-type doped silicon layers or n-type doped layers. In yet another implementation, the first material layers 142 are group III-V materials, such as a GaAs layer. In still another implementation, the second material layers 144 are silicon layers and the first material layers 142 are a metal material having a high-k material coating on outer surfaces of the metal material. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation, the coating layer is a hafnium dioxide (HfO2) layer.

Spacers 146 are formed adjacent to the ends of the first material layers 142 and may be considered a portion of the first material layers 142. The spacers 146 are dielectric spacers, air gaps, or a combination of dielectric spacers and air gaps. The spacers 146 may be formed by etching away a portion of each of the first material layers 142 using an etching precursor to form a recess at the ends of each of the first material layers 142. The spacers 146 are formed in the recesses adjacent each of the first material layers 142. A liner layer (not shown) may additionally be deposited within the recesses before the deposition of the spacers 146. The spacers 146 are formed from a dielectric material and separate each of the nanowires or nanosheets formed as the second material layers 144. In at least one implementation, the spacers 146 are selected to be a silicon-containing material that may reduce parasitic capacitance between the gate and source/drain structure in the GAA nanowire structure, such as a low-k material. The silicon-containing material or the low-k material may be silicon nitride, silicon oxide, silicon oxynitride, silicon carbide, silicon oxycarbide, silicon carbide nitride, doped silicon layer, or other suitable materials, such as Black Diamond® material available from Applied Materials. In one example, the spacers 146 are a low-k material (e.g., dielectric constant less than 4) or a silicon oxide/silicon nitride/silicon carbide containing material. In another example, the spacers 146 are air gaps.

Each of the second material layers 144 is a crystalline layer, such as a single crystalline, polycrystalline, or monocrystalline silicon layer. The second material layers 144 are formed using an epitaxial deposition process. Alternatively, the second material layers 144 are doped silicon layers, including p-type doped silicon layers or n-type doped layers. Suitable p-type dopants include B dopants, Al dopants, Ga dopants, In dopants, or the like. Suitable n-type dopant includes N dopants, P dopants, As dopants, Sb dopants, or the like. In yet another alternative, the second material layers 144 are a group III-V material, such as a GaAs layer.

The multi-material layer 130 further includes the oxide layer 150*a-c* disposed on the superlattice structure 141.

As depicted in FIG. 1, the multi-material layer 130 is patterned to form fins, such as a first fin 140*a*, a second fin 140*b*, and a third fin 140*c*. The fins 140*a-c* are each disposed on and aligned with a corresponding isolation region 112*a-c*. For example, the first fin 140*a* is disposed on the isolation region 112*a*, the second fin 140*b* is disposed on the isolation region 112*b*, and the third fin 140*c* is disposed on the isolation region 112*c*. Formation of and alignment of the fins 140*a-c* over the isolation regions 112*a-c* respectively, enables isolation of the substrate 110 from the fins 140*a-c* by creating a pseudo-SOI structure, which reduces substrate leakage currents. As shown in FIG. 1, the fin(s) include portions of the buffer layer 134, portions of the first material layer 142, portions of the second material layer 144, and portions of the oxide layer 150. Although three fins 140*a-c* are shown in FIG. 1, it should be understood that any suitable number and type of fins may be utilized.

The GAA structure 100 further includes source/drain regions 160*a-b*. The source/drain regions 160*a-b* are formed in a recess defined by adjacent fins 140*a-c*. For example, as shown in FIG. 1, the source/drain region 160*a* is formed in a recess defined between the first fin 140*a* and the second fin 140*b* and the source/drain region 160*b* is formed in a recess defined between the second fin 140*b* and the third fin 140*c*. In at least one implementation, the source/drain regions 160*a-b* are formed from doped silicon, including p-type doped silicon and n-type doped silicon. In implementations where the GAA structure 100 is an n-channel metal oxide semiconductor (NMOS) the source/drain regions 160*a-b* are formed from silicon doped with n-type dopants. Suitable n-type dopants include N dopants, P dopants, As dopants, Sb dopants, the like, or a combination thereof. In implementations where the GAA structure 100 is a p-channel metal oxide semiconductor (PMOS) the source/drain regions 160*a-b* are formed from silicon doped with p-type dopants. Suitable p-type dopants include B dopants, Al dopants, Ga dopants, In dopants, the like, or a combination thereof.

As depicted in FIG. 1, the source/drain regions 160*a-b* include a bottom surface 161*b*, a top surface 161*t*, and at least one sidewall 161*s*. In at least one implementation as depicted in FIG. 1, the source/drain regions 160*a-b* extend from a sidewall of a fin, for example, the first fin 140*a* to the sidewall of an adjacent fin, for example, the second fin 140*b*. The bottom surface 161*b* is defined by the top surface 119*t* of the buffer regions 118*a-b*. The at least one sidewall 161*s* is defined by the buffer layer 134 and the superlattice structure 141, for example the spacers 146 and the second material layer 144.

In at least one implementation, the top surface 161*t* of the source/drain regions 160*a-b* are offset relative to a top surface of the fins 140*a-c*. In one example, as shown in FIG. 1, the top surface 161*t* of the source/drain regions 160*a-b* defines a plane that is located above a plane defined by the top surface of the fins 140*a-c*.

Figure 2:
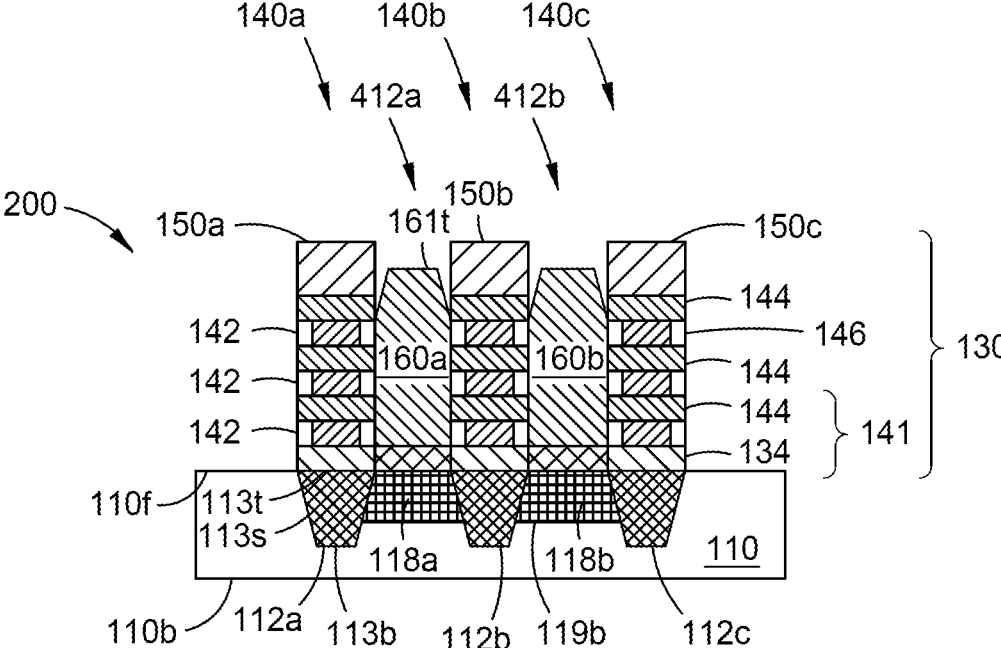
FIG. 2 illustrates a schematic cross-sectional view of another GAA structure in accordance with one or more implementations of the present disclosure.

FIG. 2 illustrates a schematic cross-sectional view of another GAA structure 200 in accordance with one or more implementations of the present disclosure. The GAA structure 200 is similar to the GAA structure 100 depicted in FIG. 1. However, the GAA structure 200 depicted in FIG. 2 further includes a bottom dielectric isolation layer 210*a-b*. The bottom dielectric isolation layer 210*a-b* is formed at the bottom of the recess defined by adjacent fins. For example, the bottom dielectric isolation layer 210*a* is formed at the bottom of the recess defined by a sidewall of the first fin 140*a* and a sidewall of the second fin 140*b*. The bottom dielectric isolation layer 210*a-b* isolates the buffer regions 118*a-b* from the source/drain regions 160*a-b* and the buffer layer 134. The bottom dielectric isolation layer 210*a-b* contacts the top surface 119*t* of the buffer regions 118*a-b*, a sidewall of the buffer layer 134, and a bottom surface 161*b* of the source/drain regions 160*a-b*.

Figure 3:
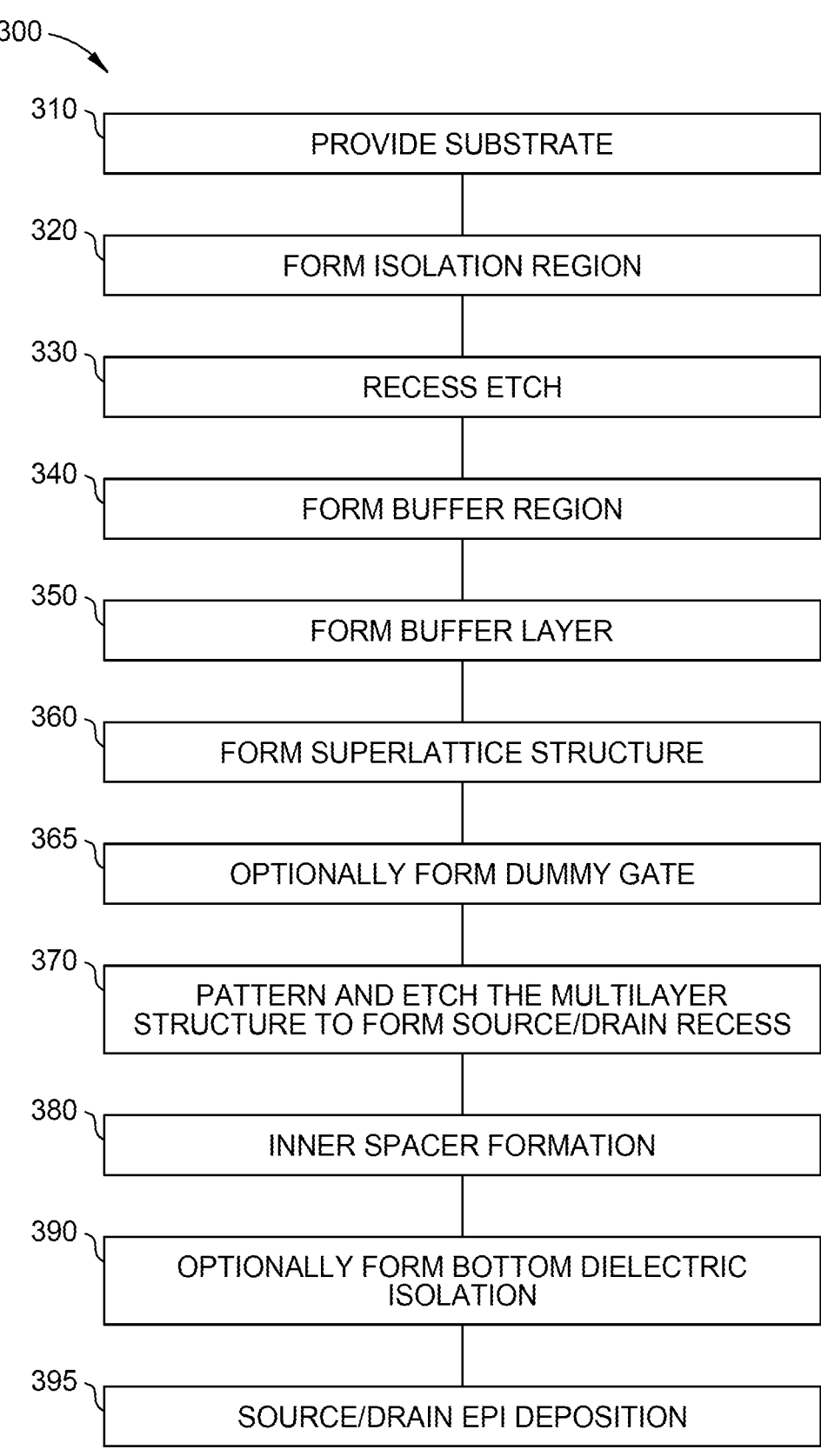
FIG. 3 illustrates an exemplary flow chart of a method of forming a GAA structure in accordance with one or more implementations of the present disclosure.

FIG. 3 illustrates an exemplary flow chart of a method 300 of forming a GAA structure in accordance with one or more implementations of the present disclosure. FIGS. 4A-4M illustrate cross-sectional views of various stages of forming a GAA structure in accordance with one or more implementations of the present disclosure. With reference to FIGS. 4A-4M, cross-sectional views of some implementations of a GAA structure at various stages of manufacture are provided to illustrate the method of FIG. 3. Although FIGS. 4A-4M are described in relation to the method 300, it will be appreciated that the structure disclosed in FIGS. 4A-4M are not limited to the method 300, but instead may stand alone as structures independent of the method 300. Similarly, although the method 300 is described in relation to FIGS. 4A-4M, it will be appreciated that the method 300 is not limited to the structures disclosed in FIGS. 4A-4M, but instead may stand alone independent of the structures disclosed in FIGS. 4A-4M.

Figure 4A:
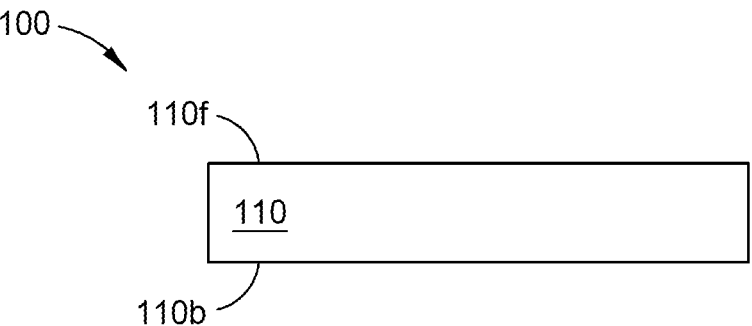
FIGS. 4A-4M illustrate cross-sectional views of various stages of forming a GAA structure in accordance with one or more implementations of the present disclosure.

FIG. 4A illustrates a cross-sectional view of a portion of the GAA structure 100 during intermediate stages of manufacturing corresponding to operation 310, in accordance with some implementations. During operation 310, a substrate is provided, for example, the substrate 110 as shown in FIG. 4A.

Figure 4B:
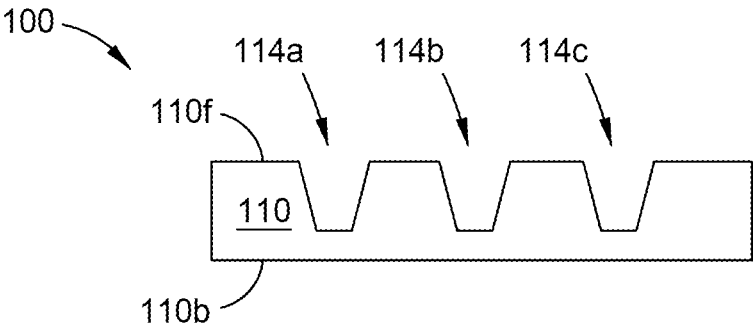
Figure 4C:
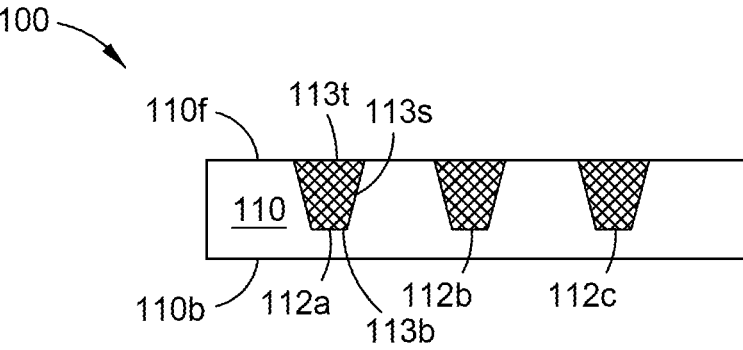

FIGS. 4B-4C illustrates a cross-sectional view of a portion of the GAA structure 100 during intermediate stages of manufacturing corresponding to operation 320, in accordance with some implementations. During operation 320, an isolation region is formed, for example, the isolation regions 112*a-c* are formed in the substrate 110, as shown in FIGS. 4B-C. Referring to FIG. 4B, trenches 114*a-c* are formed in the substrate 110. The trenches 114*a-c* extend from the frontside 110*f* of the substrate 110 into the substrate 110. The trenches 114*a-c* may be formed by a patterning and etching process. The patterning and etching process may include forming a mask layer on the frontside 110*f* of the substrate 110. The mask layer may be patterned utilizing photolithography techniques. Generally, a photoresist material (not shown) is deposited over the mask layer. The photoresist material is irradiated (exposed) with radiation, for example, light, through a patterned reticle in order to induce a reaction in the portions of the photoresist material exposed to the energy. The photoresist material is developed to remove a portion of the photoresist material, wherein the remaining photoresist material protects the underlying material of the substrate 110 from subsequent processing operations, such as etching.

Referring to FIG. 4C, an isolation material is deposited in the trenches 114*a-c* to form corresponding isolation regions are 112*a-c* in the substrate 110. In at least one implementation, the isolation material is deposited utilizing a process such as chemical vapor deposition (CVD), flowable CVD (FCVD), or a spin-on-glass process, although any acceptable process may be utilized. Subsequently, the isolation regions are 112*a-c* may be subject to one or more of a mask removal process and a planarization process for removal of portions of the isolation regions 112*a-c* extending over the frontside 110*f* of the substrate 110, for example, an etch process, chemical mechanical polishing (CMP) process, or the like. The planarization process may be performed such that the top surface 113*t* of the isolation regions 112*a-c* is coplanar or substantially coplanar with the frontside 110*f* of the substrate 110.

Figure 4D:
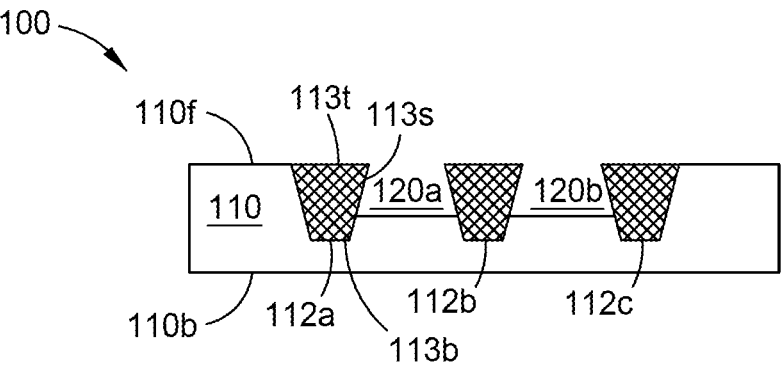

FIG. 4D illustrates a cross-sectional view of a portion of the GAA structure 100 during intermediate stages of manufacturing corresponding to operation 330, in accordance with some implementations. During operation 330, recesses, for example, the recesses 120*a-b*, are formed in the substrate 110. The recesses 120*a-b* may be formed by a patterning and etching process. The recesses 120*a-b* extend from the frontside 110*f* of the substrate 110 into the substrate 110. The recesses 120*a-b* are defined by the sidewalls 113*s* of the isolation regions 112*a-c*. For example, as shown in FIG. 4D, the recess 120*a* is defined by the sidewall 113*s* of the isolation region 112*a* and the sidewall 113*s* of the isolation region 112*b* and the recess 120*b* is defined the sidewall 113*s* of the isolation region 112*b* and the sidewall 113*s* of the isolation region 112*c*. The recesses 120*a-b* may be formed by a patterning and etching process. The etching process may be a selective etching process, which selectively removes material of the substrate 110 (e.g., silicon) relative to the material of the isolation regions 112*a-c* (e.g., an oxide such as silicon oxide) to form the recesses 120*a-b*.

Figure 4E:
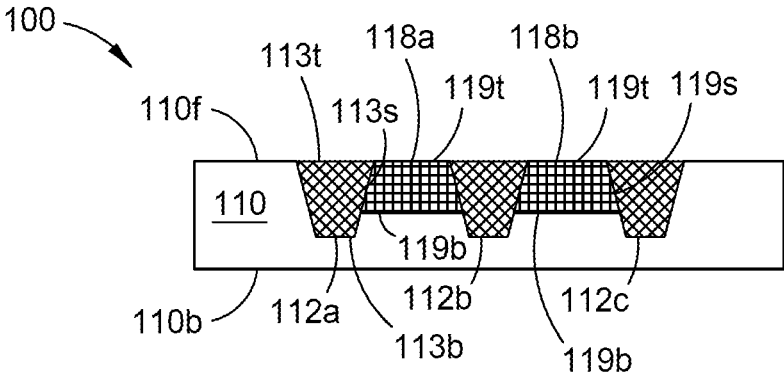

FIG. 4E illustrates a cross-sectional view of a portion of the GAA structure 100 during intermediate stages of manufacturing corresponding to operation 340, in accordance with some implementations. During operation 340, the recesses 120*a-b* are filled with a strain relaxed buffer (SRB) material to form the buffer regions 118*a-b*. The buffer regions 118*a-b* are formed by filling the recesses 120*a-b* with the SRB material. The buffer regions 118*a-b* include the top surface 119*t* and the bottom surface 119*b*. In at least one implementation, the strain relaxed buffer material has a graded concentration of at least one component, for example, germanium. In at least one implementation, the SRB material includes Group IV materials, such as silicon and germanium. In one example, the SRB material includes $Si_{1-x}Ge_x$, where x is germanium concentration. The concentration (atomic percent) of germanium in the buffer regions 118*a-b* may be graded. In at least one implementation, the SRB material is deposited into the recesses 120*a-b* via an epitaxial chemical vapor deposition process. The epitaxial deposition process provides for precise control of the germanium content in each of the buffer regions 118*a-b* and the subsequently formed buffer layer 134, which provides advantageous control of lattice matching with the substrate 110, the subsequently deposited superlattice structure 141, or both the substrate 110 and the subsequently deposited superlattice structure 141. In one example, the relaxed epitaxial Si(1−x)Ge(x) buffer material is grown in the recesses 120*a-b* such that dislocations annihilate on the sidewalls 113*s* of the isolation regions 112*a-c*.

In at least one implementation, the buffer region 118*a-b* includes a $Si_{1-x}Ge_x$ material having a graded germanium concentration, wherein the germanium concentration at an interface of the bottom surface 119*b* of the buffer regions 118*a-b* and the substrate 110 is similar to a germanium concentration of the substrate 110 (e.g., 0 at %), a germanium concentration at an interface of the top surface 119*t* of the buffer regions 118*a-b* and the backside surface 134*b* of the buffer layer 134' (e.g., 10-15 at %) is similar to a uniform or substantially uniform germanium concentration of the buffer layer 134' (e.g., 10-15 at %), and the uniform or substantially uniform germanium concentration of the buffer layer 134' is similar to a germanium concentration of an adjacent SiGe layer in the superlattice structure (e.g., 10-15 at %).

Figure 4F:
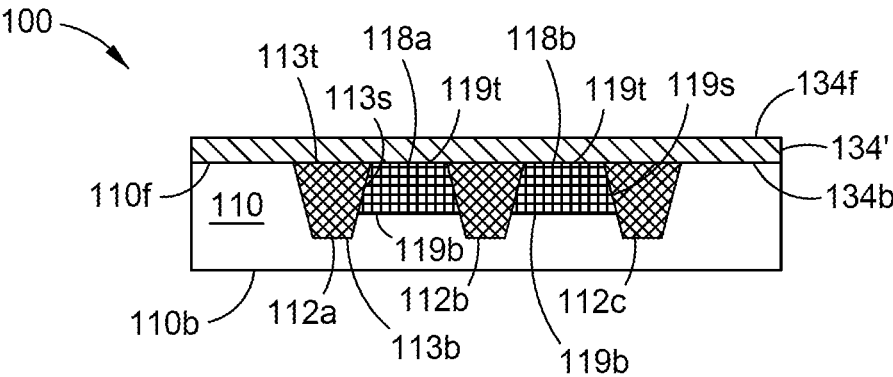

FIG. 4F illustrates a cross-sectional view of a portion of the GAA structure 100 during intermediate stages of manufacturing corresponding to operation 350, in accordance with some implementations. During operation 350, a buffer layer 134' is formed. The buffer layer 134' is formed on the frontside 110*f* of the substrate 110. The buffer layer 134' has a backside surface 134*b* and a frontside surface 134*f* (also referred to as a front surface) opposite the backside surface 134*b* (also referred to as a back surface). The backside surface 134*b* contacts the frontside 110*f* of the substrate 110, the top surface 113*t* of the isolation regions 112*a-c*, and the top surface 119*t* of the buffer regions 118*a-b*. In at least one implementation, the buffer layer 134' is formed via an epitaxial chemical vapor deposition process. In at least one implementation, the buffer layer 134' is formed via the same epitaxial deposition process used to form the buffer regions 118*a-b*. In another implementation, the buffer layer 134' is formed via a different epitaxial deposition process.

The epitaxial deposition process provides for precise control of the germanium content in each of the buffer regions 118*a-b* and the buffer layer 134, which provides advantageous control of lattice matching with the substrate 110, the subsequently deposited superlattice structure 141, or both the substrate 110 and the subsequently deposited superlattice structure 141.

In at least one implementation, the buffer layer 134' comprises a crystalline material selected from silicon, silicon germanium, or a combination of silicon and silicon germanium. In at least one implementation, the buffer layer 134' has a germanium concentration gradient. The germanium concentration gradient may increase from the backside surface 134*b* of the buffer layer 134' to the frontside surface 134*f* of the buffer layer 134'. The buffer layer 134' may be a SiGe spacer layer.

In at least one implementation, the concentration of germanium in the buffer layer 134' may be lowest near an interface with the frontside 110*f* of the substrate 110 (e.g., near the backside surface 134*b* of the buffer layer 134') and increase to be highest near the interface with the superlattice structure 141. In another implementation, the concentration of germanium in the buffer layer 134' may be highest near an interface with the frontside 110$f$ of the substrate 110 (e.g., near the backside surface 134$b$ of the buffer layer 134 and decrease to be lowest near the interface with the superlattice structure 141.

In at least one implementation, the buffer layer 134' comprises the silicon germanium and the silicon germanium has a uniform or substantially uniform germanium concentration that is equal to or substantially equal to the germanium concentration "x" in the relaxed Si(1–x)Ge(x) material the top surface 119$t$ of the buffer region 118$a$-$b$.

In at least one implementation, the buffer region 118$a$-$b$ includes a Si$_{1-x}$Ge$_x$ material having a graded germanium concentration, wherein the germanium concentration at an interface at the bottom surface 119$b$ of the buffer regions 118$a$-$b$ and the substrate 110 is similar to a germanium concentration of the substrate 110 (e.g., 0 at %), and a germanium concentration at an interface of the top surface 119$t$ of the buffer regions 118$a$-$b$ is similar to the germanium concentration of the backside surface 134$b$ of the buffer layer 134' and the frontside surface 134$f$ of the buffer layer 134' (e.g., 10-15 at %) is similar to a uniform or substantially uniform germanium concentration of the subsequently deposited superlattice structure 141.

In at least one implementation, the graded germanium concentration of the buffer layer 134' has a germanium content that increases in a range from about 0% to about 20%, or in a range from about 0% to about 15%, or in a range from about 0.1% to about 15%, or in a range from about 0.5% to about 15%, or in a range from about 1% to about 15%, or in a range from about 1% to about 10%. The silicon content of the buffer layer 134' may be in a range from about 80% to about 100%, or in a range from about 85% to about 100%, or in a range from about 85% to about 99.9%, or in a range from about 85% to about 99.5%, or in a range from about 90% to about 99%. The buffer layer 134' may have a maximum germanium content that is equal to or less than 10%, that is equal to or less than 15%, or that is equal to or less than 20%.

The buffer layer 134' may be exposed to a planarization process. In at least one implementation, the frontside surface 134$f$ of the buffer layer 134' has high surface roughness. This high surface roughness of the frontside surface 134$f$ of the buffer layer 134' makes it challenging to use the buffer layer 134' as a template for subsequent growth of the superlattice structure 141 on the buffer layer 134'. The planarization process removes a portion of the frontside surface 134$f$ of the buffer layer 134' to form a smoothed surface. Any suitable planarization process may be used. The planarization process may be a chemical mechanical polishing (CMP) process or an etchback process.

Figure 4G:
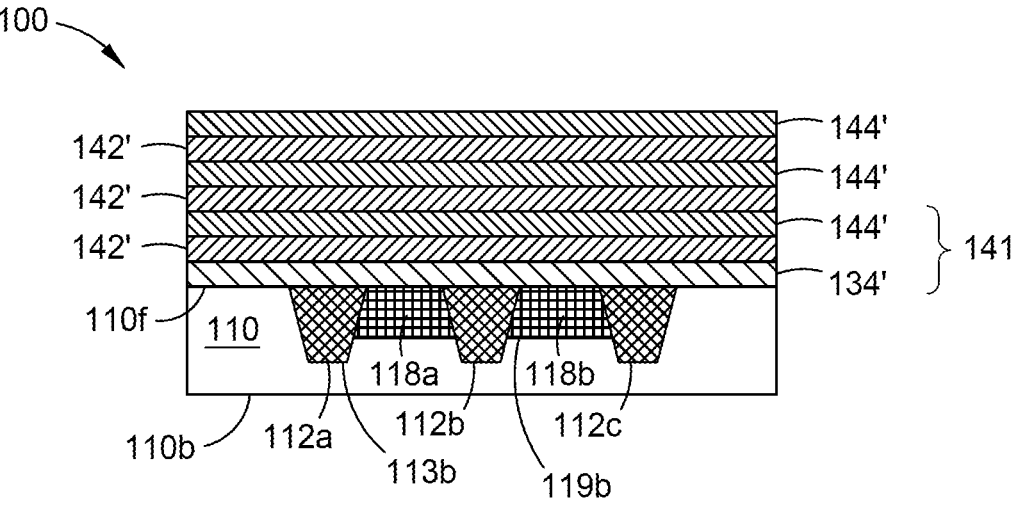

FIG. 4G illustrates a cross-sectional view of a portion of the gate-all-around structure 100 during intermediate stages of manufacturing corresponding to operation 360, in accordance with some implementations. During operation 360, a superlattice structure, for example, the superlattice structure 141 is formed over the substrate 110, for example, on the buffer layer 134'. The superlattice structure 141 includes at least one pair of layers, each pair including the first material layer 142' and the second material layer 144'. Although the example depicted in FIG. 4G shows three pair, each pair includes the first material layer 142' and the second material layer 144' (alternating pairs, each pair including the first material layer 142' and the second material layer 144'). The number of pairs may be varied based on different process needs with extra or without extra first material layers 142 or second material layers 144 being needed.

The first material layers 142' are non-crystalline material layers. In at least one implementation, the first material layers 142' are Ge containing layers, such as SiGe layers, Ge layers, or other suitable layers. Alternatively, the first material layers 142' are doped silicon layers, including p-type doped silicon layers or n-type doped layers. In yet another implementation, the first material layers 142' are group III-V materials, such as a GaAs layer. The first material layers 142' are formed using an epitaxial deposition process performed in an epitaxial deposition chamber.

The second material layers 144' are crystalline material layers such as a single crystalline, polycrystalline, or monocrystalline silicon layer. The second material layers 144' are formed using an epitaxial deposition process performed in an epitaxial deposition chamber. Alternatively, the second material layers 144' are doped silicon layers, including p-type doped silicon layers or n-type doped silicon layers. Suitable p-type dopants include B dopants, Al dopants, Ga dopants, In dopants, or the like. Suitable n-type dopant includes N dopants, P dopants, As dopants, Sb dopants, or the like. In yet another alternative, the second material layers 144 are a group III-V material, such as a GaAs layer.

Figure 4H:
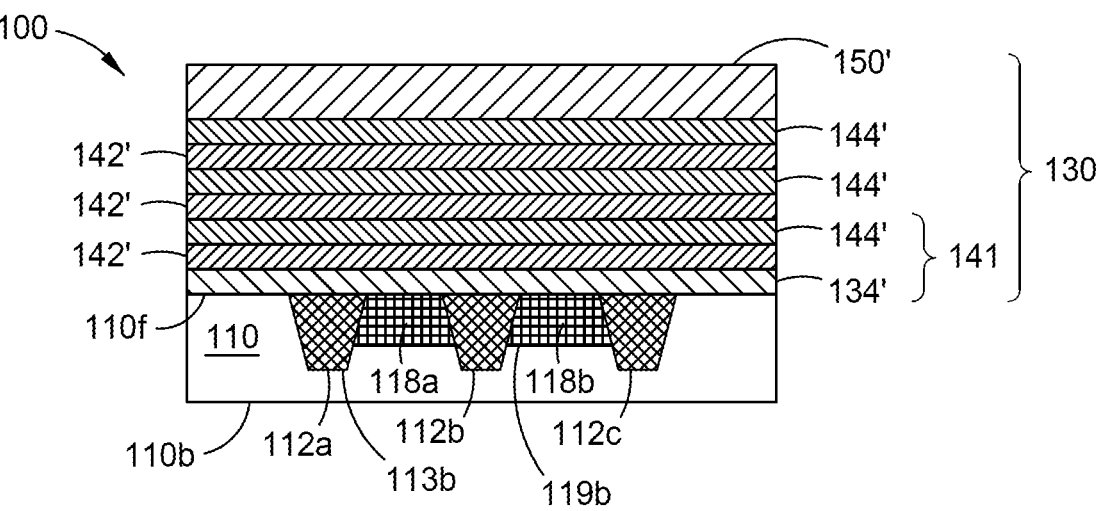

FIG. 4H illustrates a cross-sectional view of a portion of the GAA structure 100 during intermediate stages of manufacturing corresponding to operation 365, in accordance with some implementations. Optionally, at operation 365, an oxide layer 150' is formed. The oxide layer 150' may be formed over the superlattice structure 141. In at least one implementation, the oxide layer 150' may be formed by a deposition process, for example, thermal oxidation, CVD, sputtering, or any other methods known and used in the art for forming a dummy gate oxide layer. In at least one implementation, the oxide layer 150' may be formed of the same material as the isolation regions 112$a$-$c$. In at least another implementation, the oxide layer 150' may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In yet another implementation, the oxide layer 150' includes dielectric materials having a high dielectric constant (k-value), for example, greater than 3.9. The materials may include silicon nitrides, oxynitrides, metal oxides such as HfO2, HfZrOx, HfSiOx, HfTiOx, HfAlOx, a combination thereof, multi-layers thereof, or the like.

Figure 4I:
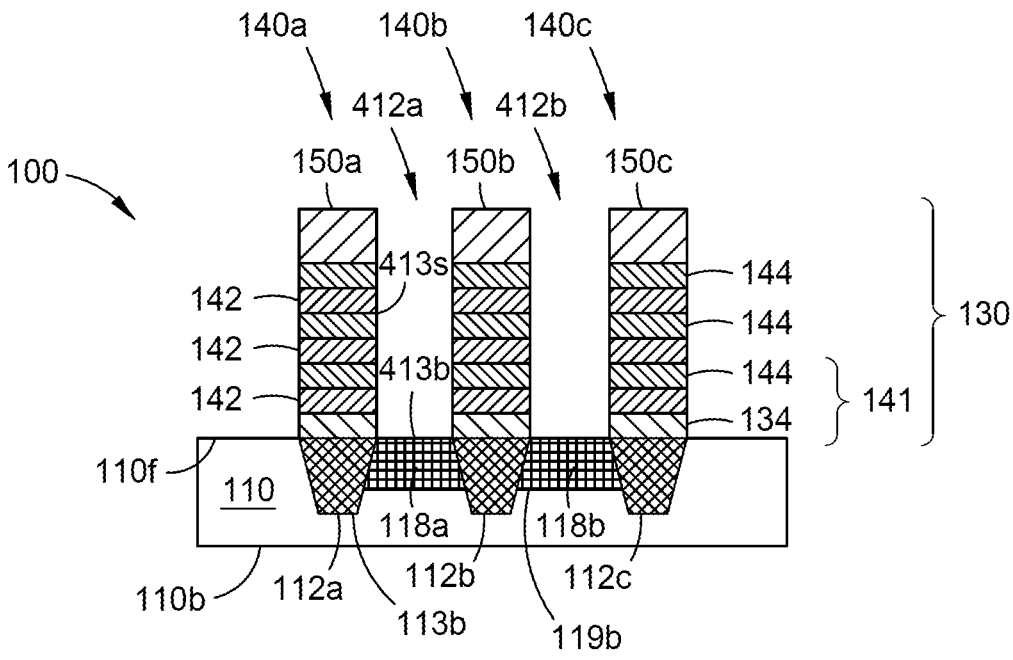

FIG. 4I illustrates a cross-sectional view of a portion of the GAA structure 100 during intermediate stages of manufacturing corresponding to operation 370, in accordance with some implementations. At operation 370, a patterning and etching process is performed to form source/drain recess 412$a$-$b$ in the multi-material layer 130 including the buffer layer 134', the superlattice structure 141, and optionally the oxide layer 150 (if present). In at least one implementation, as is shown in FIG. 4I, the source/drain recess 412$a$-$b$ are defined by a sidewall 413$s$ and a bottom surface 413$b$. The sidewall 413$s$ is defined by the buffer layer 134, the superlattice structure 141, and the oxide layer 150$a$-$c$ (if present) of the fins 140$a$-$c$. The bottom surface 413$b$ is defined by the top surface 119$t$ of the buffer regions 118$a$-$b$. The patterning and etching process of operation 370 may include forming a hardmask layer on a top surface of the superlattice structure 141 or on the top surface of the oxide layer 150' (if present). In at least one implementation, photolithography techniques are utilized to pattern the hardmask layer. Generally, a photoresist material (not shown) is deposited over the hardmask layer. The photoresist material is irradiated (exposed) with radiation, for example, light, through a patterned reticle in order to induce a reaction in the portions of the photoresist material exposed to the energy. The photoresist material is developed to remove a portion of the photoresist material, wherein the remaining photoresist material protects the underlying material from subsequent processing operations, such as etching. In at least one implementation, the etching process is a reactive ion etching (RIE) process or the like. In one example, the RIE process is performed utilizing a chlorine, bromine, or fluorine-based chemistry to anisotropically etch the super lattice structure.

As shown in FIG. 4I, after the etching process is performed to the superlattice structure 141, remaining regions of the superlattice structure 141 and the underlying substrate 110 form fins, such as the first fin 140a, the second fin 140b, and the third fin 140c. As can be seen in FIG. 4I, the fins 140a-c include portions of the buffer layer 134, portions of the superlattice structure 141 (e.g., portions of the first material layers 142' (e.g., silicon layers) and portions of the second material layers 144' (e.g., SiGe layers)), and portions of the oxide layer 150a-c. Although three fins 140a-c are shown in FIG. 4I, it is to be understood that any suitable number and type of fins may be utilized.

Figure 4J:
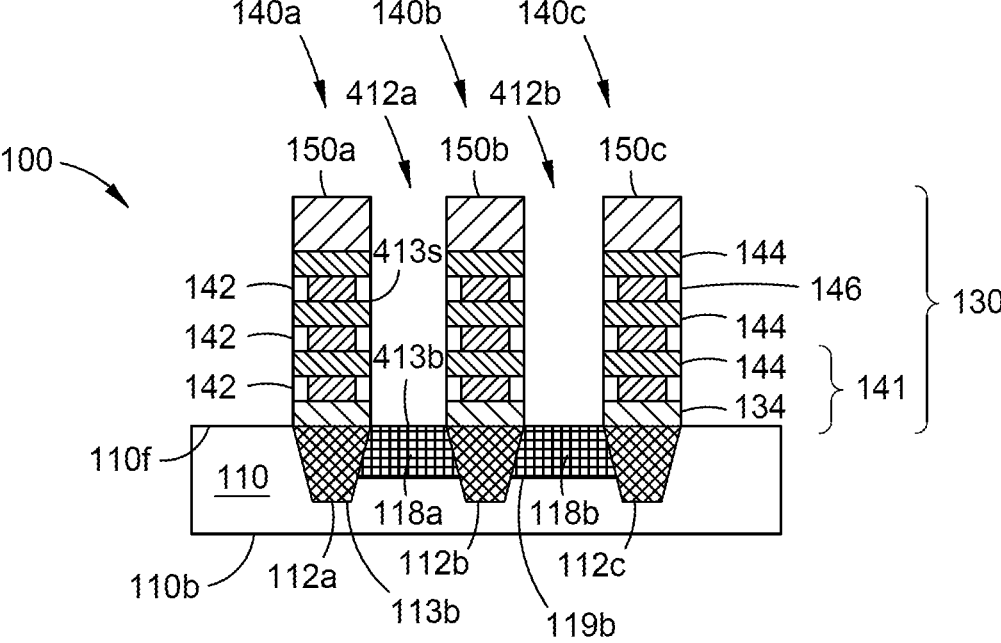

FIG. 4J illustrates a cross-sectional view of a portion of the GAA structure 100 during intermediate stages of manufacturing corresponding to operation 380, in accordance with some implementations. At operation 380, inner spacers, for example, the spacers 146 are formed. As shown in FIG. 4J, the spacers 146 are formed adjacent to the ends of the first material layers 142 and may be considered a portion of the first material layers 142. The spacers 146 are dielectric spacers, air gaps, or both dielectric spacers and air gaps. The spacers 146 may be formed by etching away a portion of each of the first material layers 142 using an etching precursor to form a recess at the ends of each of the first material layers 142. The spacers 146 are formed in the recesses adjacent each of the first material layers 142. A liner layer (not shown) may additionally be deposited within the recesses before the deposition of the spacers 146. The spacers 146 are formed from a dielectric material and separate each of the nanowires or nanosheets formed as the second material layers 144. In at least one implementation, the spacers 146 are selected to be a silicon-containing material that may reduce parasitic capacitance between the gate and source/drain structure in the GAA nanowire structure, such as a low-k material. The silicon-containing material or the low-k material may be silicon nitride, silicon oxide, silicon oxynitride, silicon carbide, silicon oxycarbide, silicon carbide nitride, doped silicon layer, or other suitable materials, such as Black Diamond® material available from Applied Materials. In one example, the spacers 146 are a low-k material (e.g., dielectric constant less than 4) or a silicon oxide/silicon nitride/silicon carbide containing material. In another example, the spacers 146 are air gaps.

Figure 4K:
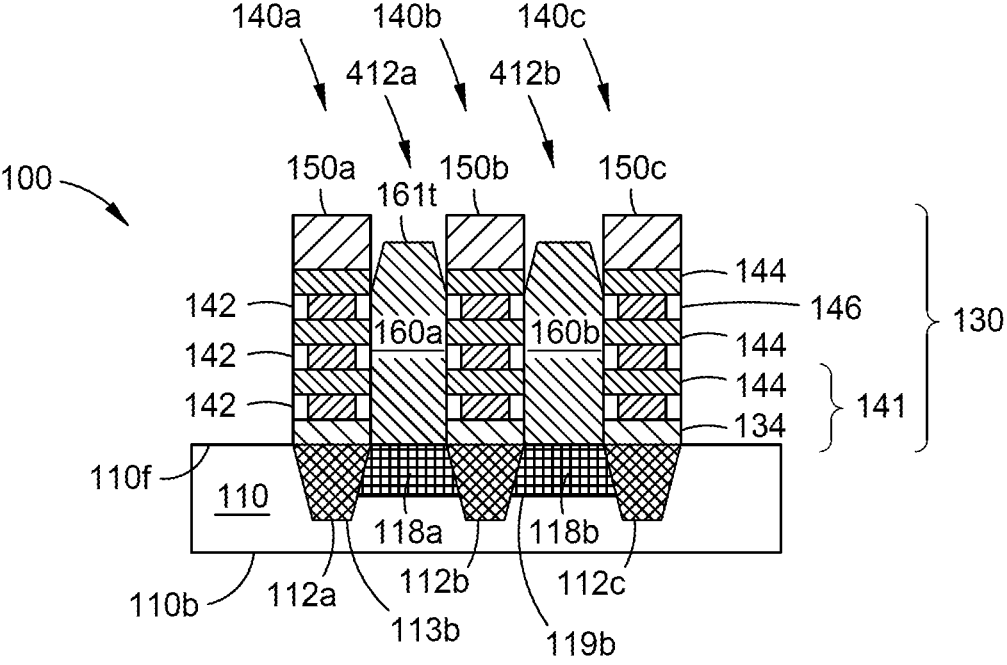

FIG. 4K illustrates a cross-sectional view of a portion of the GAA structure 100 during intermediate stages of manufacturing corresponding to operation 395, in accordance with some implementations. At operation 395, the source/drain regions 160a-b are formed in the source/drain recesses 412a-b. The source/drain region 160a fills the source/drain recess 412a in between the first fin 140a and the second fin 140b and the source/drain region 160b fills the source/drain recess 412b in between the second fin 140b and the third fin 140c. In at least one implementation, as shown in FIG. 4L, the source/drain regions 160a-b contact sidewalls of the fins 140a-c and the top surface 119t of the buffer regions 118a-b.

The source/drain regions 160a-b may be formed via an epitaxial deposition process. The use of an epitaxially grown material in the source/drain regions 160a-b allows the source/drain regions 160a-b to exert stress in the channel regions. The materials used for the source/drain regions 160a-b may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. However, any suitable material may be used. The epitaxial source/drain regions 160a-b may be doped either through an implanting process to implant appropriate dopants, or by in-situ doping as the material is grown. In at least one implementation, the first source/drain regions 160a is formed of SiC or SiP doped with phosphorus (P) to form an n-type FinFET device and the second source/drain region 160b is formed of SiGe or Ge doped with boron (B) to form a p-type FinFET device.

Figure 4L:
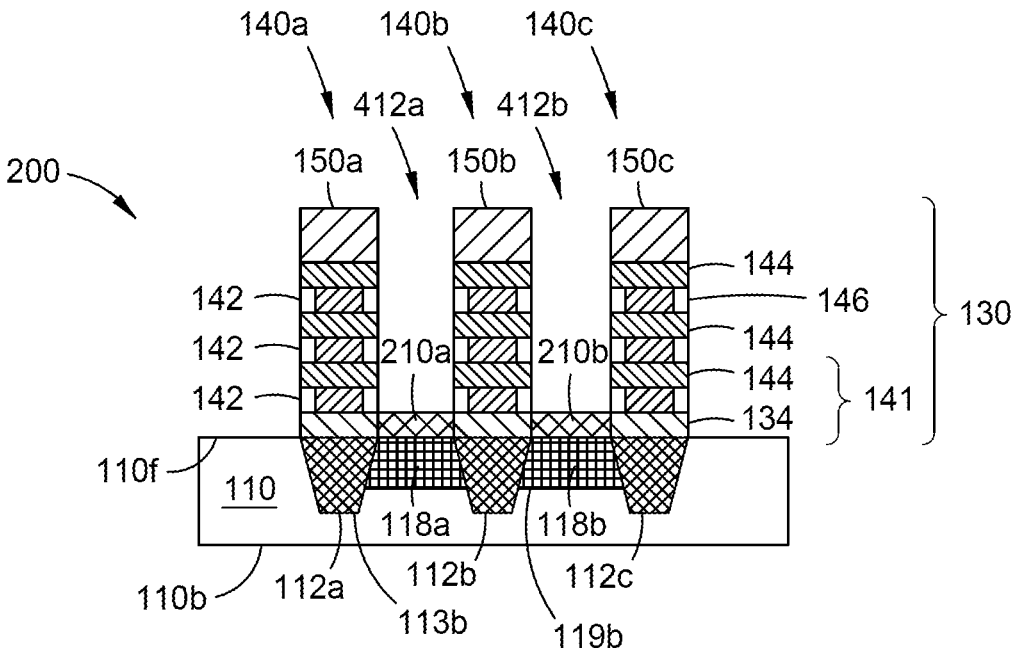

FIG. 4L illustrates a cross-sectional view of a portion of the GAA structure 200 during intermediate stages of manufacturing corresponding to optional operation 390, in accordance with some implementations. The GAA structure 200 depicted in FIG. 4L is similar to the GAA structure 100 depicted in FIG. 4K, except that the gate-all-around structure 200 includes the bottom dielectric isolation layer 210a-b, which is formed prior to source/drain deposition of operation 395. At optional operation 390, a bottom dielectric isolation layer 210a-b is formed. The bottom dielectric isolation layer 210a-b is formed at the bottom of the source/drain recess 412a-b. The bottom dielectric isolation layer 210a-b isolates the subsequently deposited source/drain region 160a-b from the buffer regions 118a-b, the buffer layer 134, and the substrate 110. In at least one implementation, the bottom dielectric isolation layer 210a-b includes a dielectric material. In one example, the dielectric material comprises, consists of, or consists essentially of silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations thereof, or the like. In one particular implementation, the isolation material comprises, consists of, or consists essentially of silicon oxide. In at least one implementation, the dielectric material of the bottom dielectric isolation layer 210a-b is formed through a process such as CVD, flowable CVD (FCVD), or a spin-on glass process, although any suitable process may be utilized. The dielectric material of the bottom dielectric isolation layer 210a-b may comprise, consist of, or consist essentially of the same material as the isolation regions 112a-c.

Figure 4M:
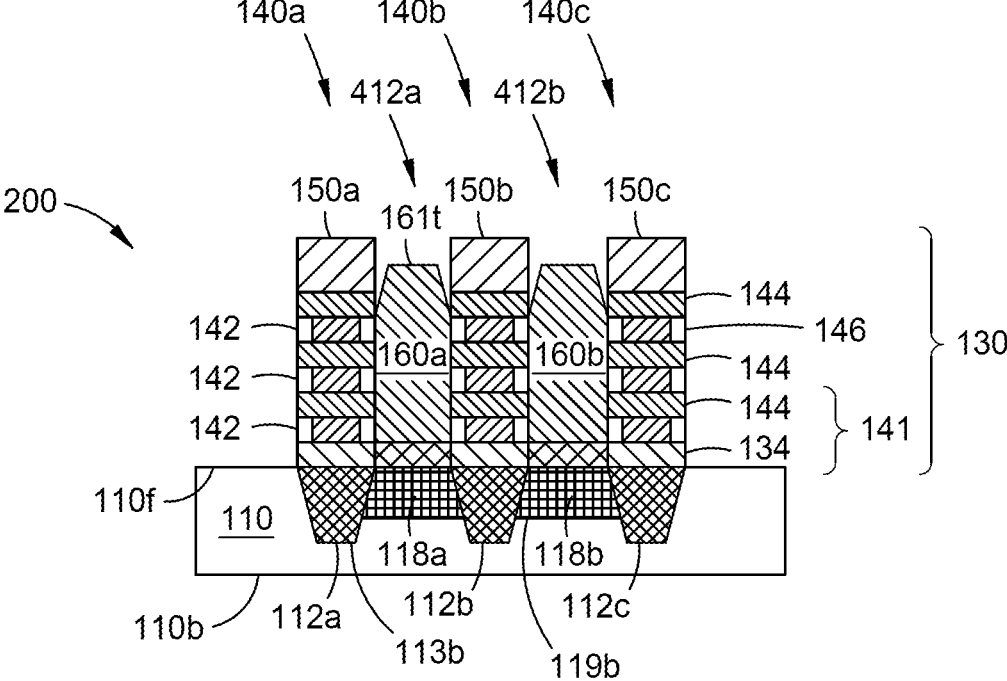

FIG. 4M illustrates a cross-sectional view of a portion of the gate-all-around structure 200 during intermediate stages of manufacturing corresponding to operation 395, in accordance with some implementations. At operation 395, the source/drain regions 160a-b are formed in the source/drain recesses 412a-b. The source/drain region 160a fills the source/drain recess 412a in between the first fin 140a and the second fin 140b and the source/drain region 160b fills the source/drain recess 412b in between the second fin 140b and the third fin 140c. In at least one implementation, as shown in FIG. 4L, the source/drain regions 160a-b contact sidewalls of the fins 140a-c and the bottom dielectric isolation layer 210a-b.

Figure 5:
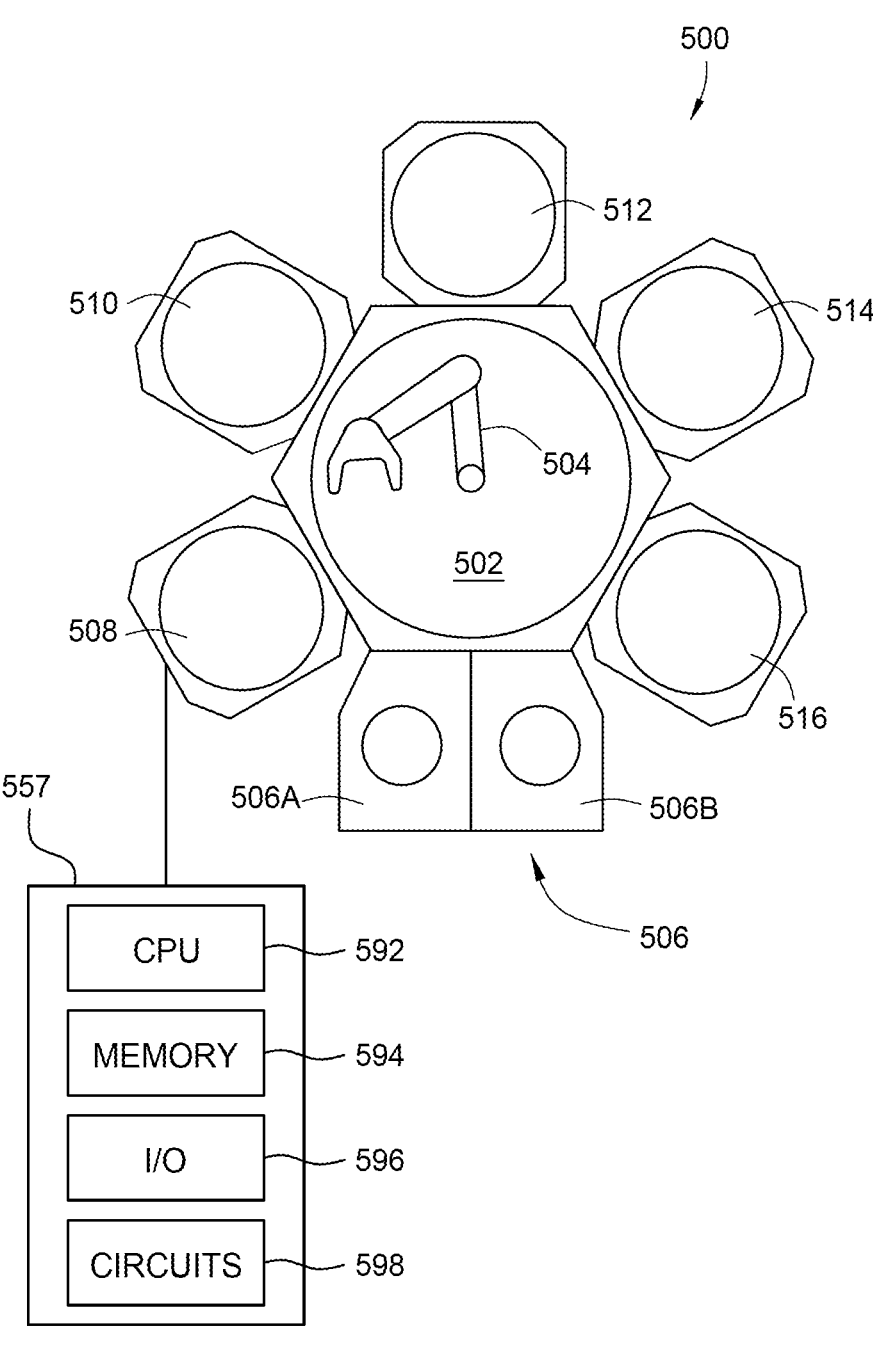
FIG. 5 illustrates a plan view of a cluster tool in accordance with one or more embodiments of the present disclosure.

FIG. 5 is a plan view of a cluster tool 500 according to another embodiment described. The cluster tool 500 features at least one epitaxial deposition chamber. One example of the cluster tool 500 is the CENTURA® EPI system available from Applied Materials, Inc., of Santa Clara, California. Cluster tools manufactured by others may be used as well. A transfer robot 504 of any convenient type is disposed in a transfer chamber 502 of the cluster tool 500. A load-lock 506, with two load-lock chambers 506A, 506B is coupled to the transfer chamber 502. A plurality of processing chambers 508, 510, 512, 514, and 516 are also coupled to the transfer chamber 502. In at least one aspect, the plurality of processing chambers 508, 510, 512, 514, and 516 includes at least one of a pre-clean chamber, a material deposition chamber such as an epitaxial deposition chamber, and a thermal processing chamber, such as an anneal, degas, or oxidation chamber.

Processing chamber 508 may be a pre-clean chamber configured to clean the substrate prior to epitaxial deposition of materials, for example, a buffer material, a strain relaxed buffer material, or a superlattice structure. The pre-clean chamber may be configured to perform the Applied Materials SICONI™ Pre-clean process. Processing chamber 510 and/or 514 may be a material deposition chamber such as an epitaxial deposition chamber capable of performing an epitaxial growth process. Processing chamber 512 and/or 516 may be additional material deposition chamber or a thermal treatment chamber capable of performing a thermal treatment process.

A system controller 557 is in communication with the transfer robot 504, and the plurality of processing chambers 508, 510, 512, 514, and 516. The system controller 557 can be any suitable component that can control the processing chambers and robots. For example, the system controller 557 can be a computer including a central processing unit (CPU) 592, memory 594, inputs/outputs 596, suitable circuits 598, and storage.

Processes may generally be stored in the memory of the system controller 557 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware embodiment, or as a combination of software and hardware. The software routine, when executed by the processor, transforms the general-purpose computer into a specific purpose computer (controller) that controls the chamber operation such that the processes are performed.

In at least one implementation, the system controller 557 has a configuration to control the epitaxial growth chamber to grow epitaxial materials, for, example at least one of the buffer regions 118a-b, the buffer layer 134', the superlattice structure 141, and the source/drain regions 160a-b.

The cluster tool 500 may be used to perform at least portions of the method 300 described above. During processing, a substrate that is to be processed may arrive to the cluster tool 500 in a pod (not shown). The substrate is transferred from the pod to the vacuum compatible load-lock chambers 506A, 506B by the factory interface robot (not shown). The substrate is then picked by the transfer robot 504 in the transfer chamber 502, which is generally kept in a vacuum state. The transfer robot 504 then loads the substrate into the processing chamber 508 for cleaning. The transfer robot 504 then picks up the substrate from the processing chamber 508 and loads the substrate into the processing chamber 510 or 514, whichever is available, for epitaxial deposition. Epitaxial materials as described may be grown on the cleaned substrate in the processing chamber 510 or 514. The transfer robot 504 then picks up the substrate from the processing chamber 510 or 514 and transfers the substrate into the processing chamber 512 or 516, which are thermal processing chambers, whichever is available. The epitaxial materials may then be exposed to a rapid heating/cooling process. The transfer robot 504 then picks the substrate from the processing chamber 512 or 516 and transfers the substrate to processing chamber 514 for deposition of additional materials over the epitaxial materials.

In the Summary and in the Detailed Description, and the Claims, and in the accompanying drawings, reference is made to particular features (including method operations) of the present disclosure. It is to be understood that the disclosure in this specification includes all possible combinations of such particular features. For example, where a particular feature is disclosed in the context of a particular aspect, implementation, or example of the present disclosure, or a particular claim, that feature can also be used, to the extent possible in combination with and/or in the context of other particular aspects and implementations of the present disclosure, and in the present disclosure generally.

The term "comprises" and grammatical equivalents thereof are used to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components. In addition, whenever a composition, an element or a group of elements is preceded with the transitional phrase "comprising" and grammatical equivalents thereof, it is understood that it is contemplated that the same composition or group of elements may be preceded with transitional phrases "consisting essentially of," "consisting of," "selected from the group of consisting of," or "is" preceding the recitation of the composition, element, or elements and vice versa.

Where reference is made to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility).

When introducing elements of the present disclosure or exemplary aspects or embodiment(s) thereof, the articles "a," "an," "the" and "said" are intended to mean that there are one or more of the elements.

While the foregoing is directed to embodiments of the present disclosure, other and further embodiments of the disclosure may be devised without departing from the basic scope thereof, and the scope thereof is determined by the claims that follow.

The invention claimed is:

1. A semiconductor device, comprising:
   a substrate, comprising:
   a plurality of isolation regions formed in the substrate, the plurality of isolation regions comprising an isolation material; and
   a buffer region formed in the substrate, the buffer region separating adjacent isolation regions; and a plurality of fins, each fin formed on a corresponding isolation region of the plurality of isolation regions, each fin, comprising:

a buffer layer contacting the isolation material; and a plurality of silicon layers and a plurality of silicon germanium layers alternatingly arranged in a plurality of stacked pairs on the buffer layer.

2. The semiconductor device of claim 1, wherein the buffer region comprises a relaxed Si(1–x)Ge(x) material, wherein x represents a concentration of germanium.

3. The semiconductor device of claim 2, wherein the buffer layer comprises a crystalline material selected from silicon, silicon germanium, or a combination of silicon and silicon germanium.

4. The semiconductor device of claim 3, wherein the concentration of germanium "x" in the relaxed Si(1–x)Ge(x) material forms a germanium concentration gradient in the buffer region.

5. The semiconductor device of claim 4, wherein the crystalline material comprises the silicon germanium and the silicon germanium has a substantially uniform germanium concentration that is equal to or substantially equal to the germanium concentration "x" in the relaxed Si(1–x)Ge(x) material at a top surface of the buffer region.

6. The semiconductor device of claim 1, further comprising source/drain regions formed in source/drain recesses defined by adjacent fins.

7. The semiconductor device of claim 6, further comprising a dielectric isolation layer separating the source/drain regions from a top surface of the buffer region.

8. The semiconductor device of claim 1, wherein the isolation regions has a thickness that is greater than a thickness of the buffer region.

9. A method of forming a semiconductor device, comprising:

forming a plurality of isolation regions in a silicon substrate, wherein the isolation regions comprise an isolation material;

removing a portion of the silicon substrate to form a recess in between adjacent isolation regions;

filling the recess with a buffer material to form a buffer region;

growing a buffer layer over the silicon substrate, the isolation material, and the buffer material;

forming a superlattice structure on the buffer layer, wherein the superlattice structure comprises a plurality of silicon layers and a plurality of silicon germanium layers alternatingly arranged in a plurality of stacked pairs;

patterning and etching the superlattice structure and the buffer layer to form fins from the superlattice structure and the buffer layer, wherein the fins are aligned with the isolation regions, and the fins define a source/drain recess; and filling the source/drain recess with an epitaxial material to form a source/drain region.

10. The method of claim 9, further comprising forming a dielectric isolation layer in the source/drain recess prior to filling the source/drain recess with the epitaxial material.

11. The method of claim 9, wherein filling the recess with the buffer material to form the buffer region, comprises epitaxially growing a relaxed Si(1–x)Ge(x) material, wherein x represents a concentration of germanium.

12. The method of claim 11, wherein growing the buffer layer over the silicon substrate, the isolation material, and the buffer material comprises epitaxially growing a crystalline material selected from silicon, silicon germanium, or a combination of silicon and silicon germanium.

13. The method of claim 12, wherein the concentration of germanium "x" in the relaxed Si(1–x)Ge(x) material forms a germanium concentration gradient in the buffer region.

14. The method of claim 13, wherein the crystalline material comprises the silicon germanium and the silicon germanium has a substantially uniform germanium concentration that is equal to or substantially equal to the germanium concentration "x" in the relaxed Si(1–x)Ge(x) material at a top surface of the buffer region.

15. The method of claim 12, wherein the crystalline material selective grows in a vertical direction from the buffer region and then grows laterally over the isolation regions.

16. A method of forming a semiconductor device, comprising:

forming a plurality of isolation regions in a silicon substrate, wherein the isolation regions comprise an isolation material;

removing a portion of the silicon substrate to form a recess in between adjacent isolation regions;

epitaxially growing a buffer material in the recess to form a buffer region;

epitaxially growing a buffer layer over the buffer region and the isolation regions, wherein the buffer layer grows epitaxially from the buffer region;

forming a superlattice structure on the buffer layer, wherein the superlattice structure comprises a plurality of silicon layers and a plurality of silicon germanium layers alternatingly arranged in a plurality of stacked pairs;

patterning and etching the superlattice structure and the buffer layer to form fins from the superlattice structure and the buffer layer, wherein the fins are aligned with the isolation regions, and the fins define a source/drain recess;

forming spacers on outer surfaces of the silicon germanium layers; and filling the source/drain recess with an epitaxial material to form a source/drain region.

17. The method of claim 16, wherein epitaxially growing the buffer material in the recess, comprises epitaxially growing a relaxed Si(1–x)Ge(x) material, wherein x represents a concentration of germanium.

18. The method of claim 17, wherein epitaxially growing the buffer layer over the buffer region and the isolation regions comprises epitaxially growing a crystalline material selected from silicon, silicon germanium, or a combination of silicon and silicon germanium.

19. The method of claim 18, wherein the concentration of germanium "x" in the relaxed Si(1–x)Ge(x) material forms a germanium concentration gradient in the buffer region.

20. The method of claim 19, wherein the crystalline material comprises the silicon germanium and the silicon germanium has a substantially uniform germanium concentration that is equal to or substantially equal to the germanium concentration "x" in the relaxed Si(1–x)Ge(x) material at a top surface of the buffer region.

* * * * *